US011300544B2

(12) United States Patent
Stewart

(10) Patent No.: US 11,300,544 B2
(45) Date of Patent: Apr. 12, 2022

(54) METHODS AND SYSTEMS FOR CONTROLLING OUTPUT AMPERAGE

(71) Applicant: Illinois Tool Works Inc., Glenview, IL (US)

(72) Inventor: Justin J. Stewart, DeWitt, IA (US)

(73) Assignee: Illinois Tool Works Inc., Glenview, IL (US)

(*) Notice: Subject to any disclaimer, the term of this patent is extended or adjusted under 35 U.S.C. 154(b) by 0 days.

(21) Appl. No.: 16/830,358

(22) Filed: Mar. 26, 2020

(65) Prior Publication Data
US 2020/0309736 A1 Oct. 1, 2020

Related U.S. Application Data

(60) Provisional application No. 62/825,902, filed on Mar. 29, 2019.

(51) Int. Cl.
*G01N 27/82* (2006.01)
*H03K 19/173* (2006.01)

(52) U.S. Cl.
CPC ........... *G01N 27/82* (2013.01); *H03K 19/173* (2013.01)

(58) Field of Classification Search
CPC ...... G01N 27/82; G01N 27/84; H03K 19/173; G05B 23/0256
See application file for complete search history.

(56) References Cited

U.S. PATENT DOCUMENTS

| 4,443,759 A * | 4/1984 | Isaacson | G01N 27/84 324/216 |
|---|---|---|---|
| 4,502,004 A | 2/1985 | Schindler | |
| 5,534,775 A * | 7/1996 | Lam | G01N 27/84 324/216 |
| 2007/0231926 A1 * | 10/2007 | Ikeda | G01N 27/745 436/526 |

(Continued)

FOREIGN PATENT DOCUMENTS

CN 105866242 8/2016

OTHER PUBLICATIONS

Int'l Search Report and Written Opinion Appln No. PCT/US2020/025115 dated Jun. 22, 2020.

(Continued)

*Primary Examiner* — Dominic E Hawkins
(74) *Attorney, Agent, or Firm* — McAndrews, Held & Malloy, Ltd.

(57) ABSTRACT

Provided is a disclosure for a magnetic particle inspection system configured to generate a magnetic field for inspection of a part, comprising a programmable logic controller (PLC), a current source, and a current sensing device. The PLC may be configured to communicate an amperage signal, for amperage of an output current, to a current source, and communicate a first signal to the current source to output the output current. The current source may be configured to adjust the amperage for the output current based on the amperage signal, and output the output current upon receiving the first signal. The current sensing device may be configured to measure an output amperage of the output current, and communicate amperage information based on the output amperage to a signal conversion device. The PLC may, in response to feedback from the signal conversion device, update the amperage signal.

20 Claims, 7 Drawing Sheets

(56) References Cited

U.S. PATENT DOCUMENTS

2008/0197797 A1* 8/2008 El-Ibiary ................ H02K 11/33
318/567
2010/0235111 A1* 9/2010 Sharp ...................... G06F 17/10
702/35
2014/0359186 A1* 12/2014 Helmschmidt ....... G06F 21/602
710/264

OTHER PUBLICATIONS

International Preliminary Report on Patentability, dated Sep. 28, 2021, in International application No. PCT/US2020/025115, filed on Mar. 27, 2020 (8 pages).

* cited by examiner

METHODS AND SYSTEMS FOR CONTROLLING OUTPUT AMPERAGE

PRIORITY/CROSS REFERENCE TO RELATED APPLICATIONS

The present application claims the benefit of U.S. Provisional Patent Application Ser. No. 62/825,902, filed Mar. 29, 2019, entitled "Methods and Systems for Controlling Output Amperage," the entire contents of which are expressly incorporated herein by reference.

BACKGROUND

The present disclosure relates to a current source, and more particularly, to a method and apparatus for providing a high current level using a programmable logic controller in a feedback loop.

Limitations and disadvantages of conventional approaches to providing a high current output will become apparent to one of skill in the art, through comparison of such approaches with some aspects of the present method and system set forth in the remainder of this disclosure with reference to the drawings.

SUMMARY

Methods and apparatus are provided for providing a high current output, substantially as illustrated by and described in connection with at least one of the figures, and as set forth more completely in the claims.

BRIEF DESCRIPTION OF THE DRAWINGS

These and/or other aspects will become apparent and more readily appreciated from the following description of the exemplary embodiments, taken in conjunction with the accompanying drawings.

DETAILED DESCRIPTION

While example methods and apparatus are disclosed, modifications to the example methods and apparatus may not be described in detail as they may be well known to a person of ordinary skill in the art.

A testing system can be used to determine if there are any defects in a part. A testing system may be, for example, a magnetic particle inspection system that generates a magnetic field at a part to be tested by introducing a current through that part. Magnetic particles that were introduced on the part prior to generating the magnetic field, or is introduced on the part at the time the magnetic field is generated, may gather at areas of defect. Accordingly, by inspecting the part for concentration(s) of magnetic particles, defects such as chips, cracks, etc. in the part may be found. The inspection may be facilitated by providing the magnetic material that is visible under, for example, ultra-violet (UV) light or visible light.

In order to generate the magnetic field, current is provided to the part being tested or to a magnetic field generator, where the current may be AC or DC and may be in the range of, for example, hundreds of amperes up to thousands of amperes. Amperage in the current may depend on, for example, the type of material the part is made of, the size of the part, the magnetic particles to be deposited on the part, etc. Accordingly, the current is controlled using feedback information to keep it within desired specifications.

While the disclosed example methods and apparatus provide improved control of current for testing systems, the disclosed methods and apparatus may be modified and/or used for any other types of devices that may need high amperage current.

Figure 1A:
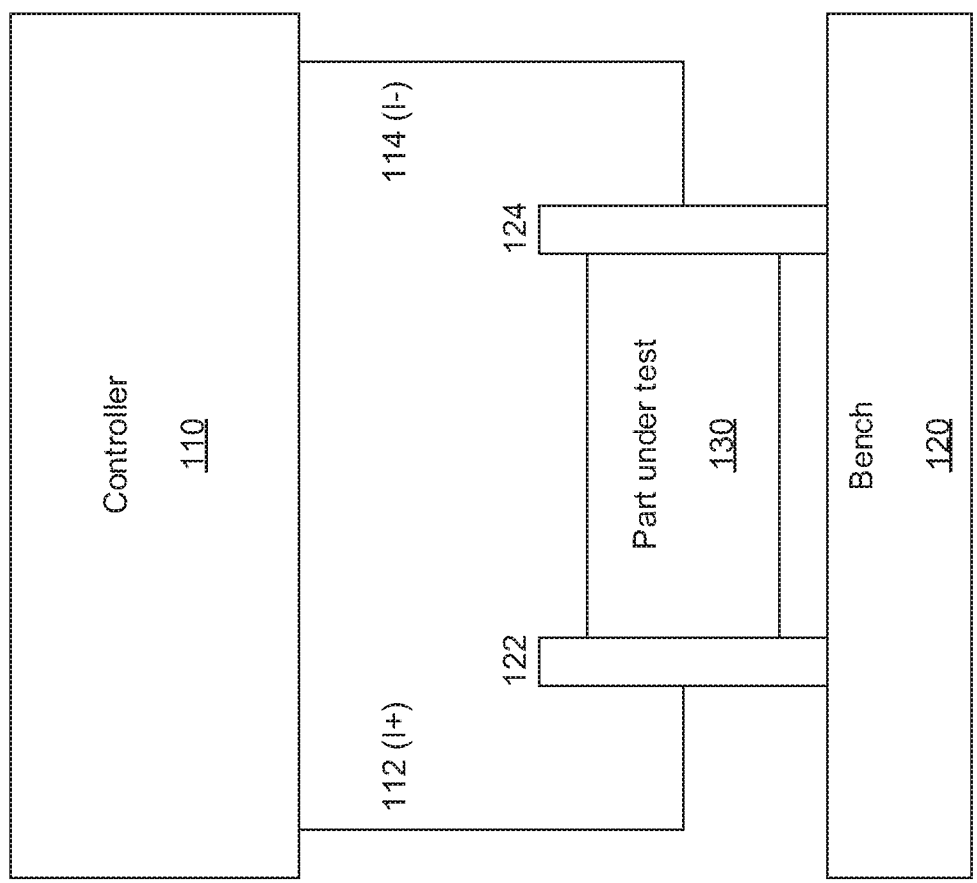
FIG. 1A is a block diagram illustrating an example testing system in accordance with aspects of this disclosure.

FIG. 1A is a block diagram illustrating an example testing system in accordance with aspects of this disclosure. Referring to FIG. 1A, there is shown an example testing system 100 that that is used to test a part 130. The testing system 100 may comprise a controller circuitry 110, the testing bench 120, the pads 122 and 124 that are configured to hold the part 130 under test, conductor 112 that conducts current from the controller circuitry 110 to the pad 122 and conductor 114 that conducts current from the pad 124 to the controller circuitry 110. The current at the pad 122 is conducted by the part 130 to the pad 124. The controller circuitry 110 is described in more detail with respect to FIGS. 1C, 2A, 2B, 3 and 4.

The bench 120 may also comprise, for example, a reservoir (not shown) that has a liquid with magnetic particles, or the reservoir may be separate from the bench 120. The liquid may be sprayed on the part 130 under test prior to the current for generating the magnetic field (mag current) being applied to the part 130, or prior to and as the mag current is applied to the part 130. The controller circuitry 110 provides the mag current to the part 130 via the conductors 112 and 114.

The mag current through the part 130 allows a magnetic field to develop around the part 130. Any faults in the part 130 may allow magnetic fields to concentrate at the faults, thereby collecting magnetic particles at those faults due to the stronger magnetic fields at the faults. The part 130 may then be inspected for areas with concentrations of the magnetic particles to determine if those areas are unexpected areas. The unexpected areas may then be flagged as faulty areas. The magnetic particles may be colored such that they are readily detected in visible light, in UV light, or in other electromagnetic (EM) spectrum(s).

The testing system 100 may receive power from, for example, a source such as a power grid or generator in a testing location, from a battery, a built-in generator, etc.

Figure 1B:
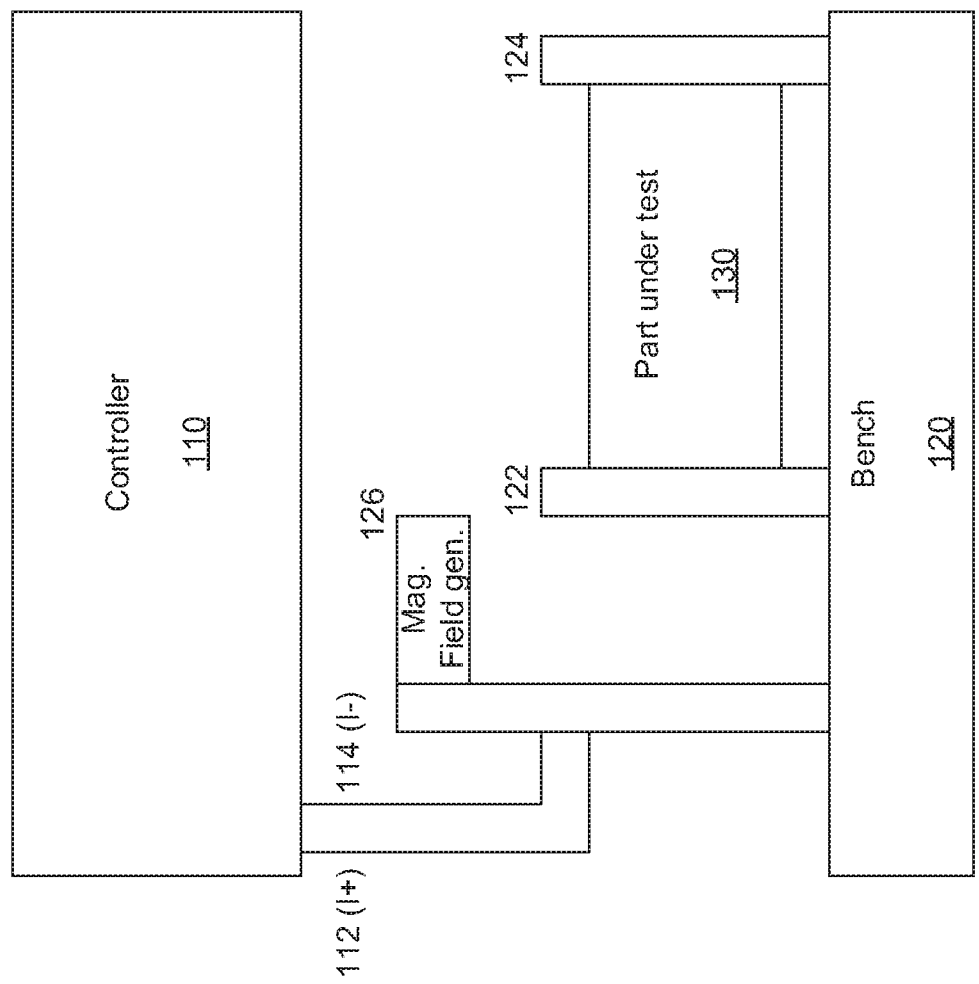
FIG. 1B is a block diagram illustrating another example testing system in accordance with aspects of this disclosure.

FIG. 1B is a block diagram illustrating another example testing system in accordance with aspects of this disclosure. FIG. 1B is similar to the example testing system 100 of FIG. 1A except that rather than the mag current being applied to the part 130, the mag current is applied to the magnetic field generator 126. This may allow magnetic fields of different orientation to be generated for testing the part 130.

Figure 1C:
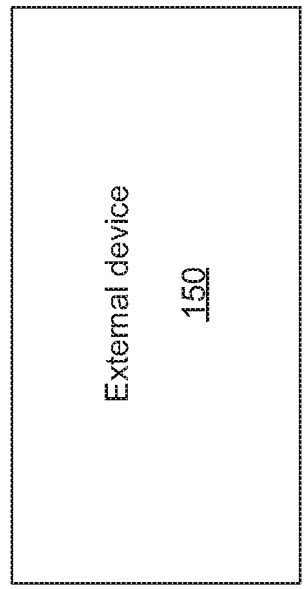
FIG. 1C is a block diagram illustrating an example testing system communicating with an external device in accordance with aspects of this disclosure.
Figure 1C:
Figure 1C:
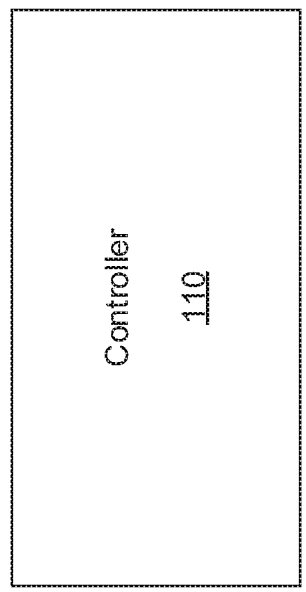

FIG. 1C is a block diagram illustrating an example testing system communicating with an external device in accordance with aspects of this disclosure. Referring to FIG. 1C, the controller circuitry 110 may comprise communication capability to communicate, wirelessly and/or via wire, with an external device 150. The communication may be via one or more appropriate wired protocol such as, for example, USB, Ethernet, Firewire, etc., or a wireless protocol such as Bluetooth, Near Field Communication (NFC), Wi-Fi, cellular protocol, etc.

The external device 150 may be, for example, an industrial monitoring/management device, a personal computer, a laptop, a server, a tablet computer, a smartwatch, etc. The external device 150 may be used to provide input to the controller circuitry 110 for testing the part 130, and or display any status from the testing system 100. For example, some embodiments of the disclosure may allow pictures and/or video to be provided from a camera (e.g., 342B) in the testing system 100 to the external device 150. The video may be stored for viewing later, viewed in real time, or monitored by, for example, software applications to detect anomalous gathering of magnetic particles.

Accordingly, some embodiments may rotate the part 130 while the camera 342B takes pictures and/or videos, while other embodiments may rotate the camera 342B around the part 130. Where the part 130 is large enough that the camera 342B is not able to provide a good view of the entire length of the part 130, the camera 342B may also be able to move along the length of the part 130, or there may be multiple cameras 342B.

Figure 2A:
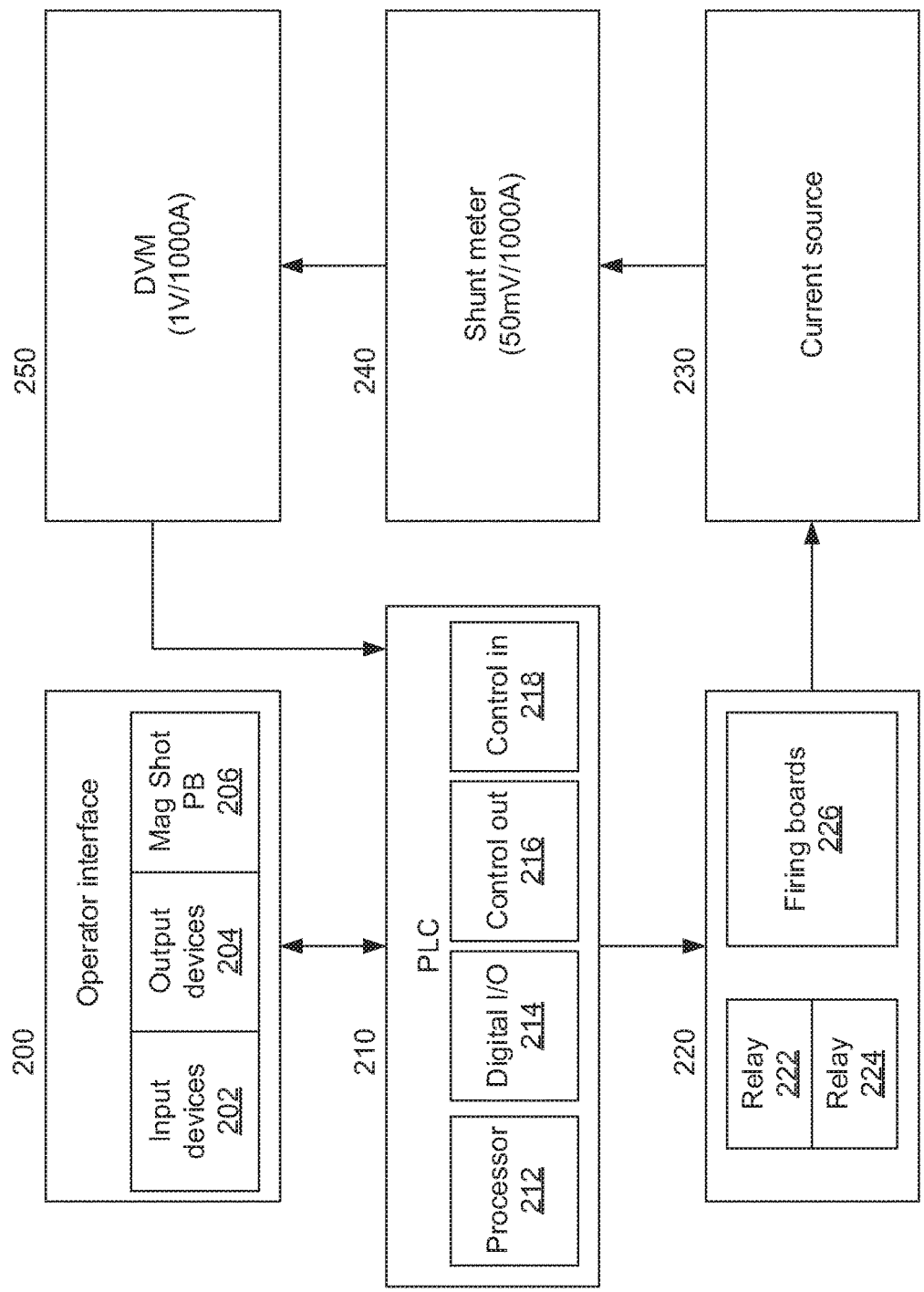
FIG. 2A is a block diagram illustrating an example of feedback in a testing system in accordance with aspects of this disclosure.

FIG. 2A is a block diagram illustrating an example of feedback in a testing system in accordance with aspects of this disclosure. Referring to FIG. 2A, there is shown a block diagram of some of the functional blocks in the controller circuitry 110. The controller circuitry 110 may comprise an operator interface 200, a programmable logic controller (PLC) 210, a current control circuitry 220, a current source 230, a shunt meter 240, and a digital voltmeter (DVM) 250.

The operator interface 200 may comprise, for example, input devices 202, output devices 204, and a mag shot button 206. The output devices 204 may comprise one or more of, for example, display screen(s), light(s), speaker(s), tactile motor(s), etc. that may be used to convey status/information to a user. The input devices 202 may comprise one or more of, for example, a keyboard, a mouse, button(s), slide switch(es), dial(s), touch screen(s), etc. that can be used to enter a selection, a command, etc.

The mag shot button 206 may be, for example, pushed to indicate when a mag current should be sent by the current source 230. The mag shot button 206 may also be considered to be one of the input devices 202. Accordingly, the mag shot button 206 may be a physical button, a physical switch, a soft button on a touch screen, a push bar on another location than the operator interface 200, etc. Various embodiments may have a mag shot push button in other locations(s) of the testing system 100 in place of the mag shot push button 206 on the operator interface 200 or in addition to the mag shot push button 206 on the operator interface 200.

The PLC 210 may comprise a processor 212, a digital interface circuitry 214, a control output circuitry 216, and a control input circuitry 218. While each of the circuitry 212, 214, 216, and 218 may comprise separate boards/modules, various embodiments of the disclosure need not be so limited. For example, the digital interface circuitry 214 may be on the same board/circuitry as the processor 212, and the control output circuitry 216 may be on the same board/circuitry as the control input circuitry 218. Various other configurations are also contemplated.

In an embodiment, the control output circuitry 216 output analog signals and the control input circuitry 218 may receive analog signals, however, they may output and receive, respectively, digital signals in addition to or in place of the analog signals.

The processor 212 executes code to execute various functions, including controlling the inputs and outputs of the digital interface circuitry 214, the control output circuitry 216, and the control input circuitry 218 to set, for example, the mag current to a correct initial value and to control the mag current depending on feedback received through the control input circuitry 218.

Accordingly, the control output circuitry 216 may output control signals to the current control circuitry 220 such that the firing boards 226 can output a mag current as determined by the PLC 210. The digital interface circuitry 214 may output signals to the relays 222 and 224 to determine whether to output an AC mag current or a DC mag current. For example, an appropriate signal to the relay 224 may determine whether to output an AC mag current or DC mag current, and an appropriate signal to the relay 222 may determine when to output the mag current by a firing board 226. The output mag current may also be referred to as a mag shot. Upon receiving the appropriate signal from the relay 222, the firing board 226 will provide a trigger signal to the current source 230 to output a mag shot.

There may be one or more firing boards 226, and each firing board may be configured to control AC mag current or DC mag current output by the current source 230, or may be configured to control both AC and DC mag current. Accordingly, the firing boards of 226 may be able to trigger mag shots for multiple parts 130 under test. The multiple parts 130 may be at the same testing bench 120, or there may be multiple testing benches 120. Similarly, the current source 230 may comprise a single circuitry to output the mag shot for the one or more parts 130 under test, or there may be a dedicated circuitry for outputting the mag shot for each part 130 and/or each testing bench 120.

For ease of description, a single part 130 will be described as being tested at a single testing bench 120. Therefore, upon receiving the appropriate signal from the relay 222, the firing board 226 will output a trigger signal to the current source 230. The current source 230 will then output a mag shot. The mag shot will be provided to the testing bench 120 via the conductor 112, either to the pad 122 or to the magnetic field generator 126. The current from the mag shot will then be returned to the controller circuitry 110 via the conductor 114.

The output current will be measured by the shunt meter 240, and that measurement will be provided to the DVM 250 in units of, for example, millivolts (mV) per 1000 amperes. The DVM 250 may be used to amplify the measurement from the shunt meter 240 to, for example, 1 V/1000 A for use by the control input circuitry 218. It should be noted that the shunt meter 240 and/or the DVM 250 may output signals with other correlation between current and voltage. For example, the shunt meter 240 may output a signal that is 20 mV/1000 A, 70 mV/1000 A, etc., or the DVM 250 may output a signal that is 0.5 V/1000 A, 1.5 V/1000 A, etc. Accordingly, the shunt meter 240 and/or the DVM 250 may provide outputs that are in a range of values, where the range may vary for different embodiments.

Additionally, the shunt meter 240 and/or the DVM 250 may allow a selection of a specific output correlation within a range supported. For example, the shunt meter 240 may allow a selection of an output that is between 10 mA/1000

A to 200 mA/1000 A. Similarly, the DVM 250 may allow a selection of an output that is between 0.5 V/1000 A to 1.5 V/1000 A.

The processor 212 in the PLC 210 may then use the feedback for the mag shot to further control the firing board 226 to output an updated trigger signal that will control the current source 230 to output a mag shot with different amperage.

It may be noted that while specific devices were named in the shunt meter 240 and the DVM 250 for ease of description, various embodiments of the disclosure need not be so limited. The shunt meter 240 may be any appropriate current sensing device configured to measure current with high amperage (e.g., tens, hundreds, thousands of amperes, or some range of amperes) and the DVM 250 may be any appropriate signal conversion device that is configured to amplify an input signal for its output signal. For example, the signal conversion device may receive 50 mV/1000 A to output 1 V/1000 A.

Additionally, while the current control circuitry 220 is shown as a separate block from the current source 230, various embodiments of the disclosure may, for example, have the current control circuitry 220 be a part of the current source 230.

Figure 2B:
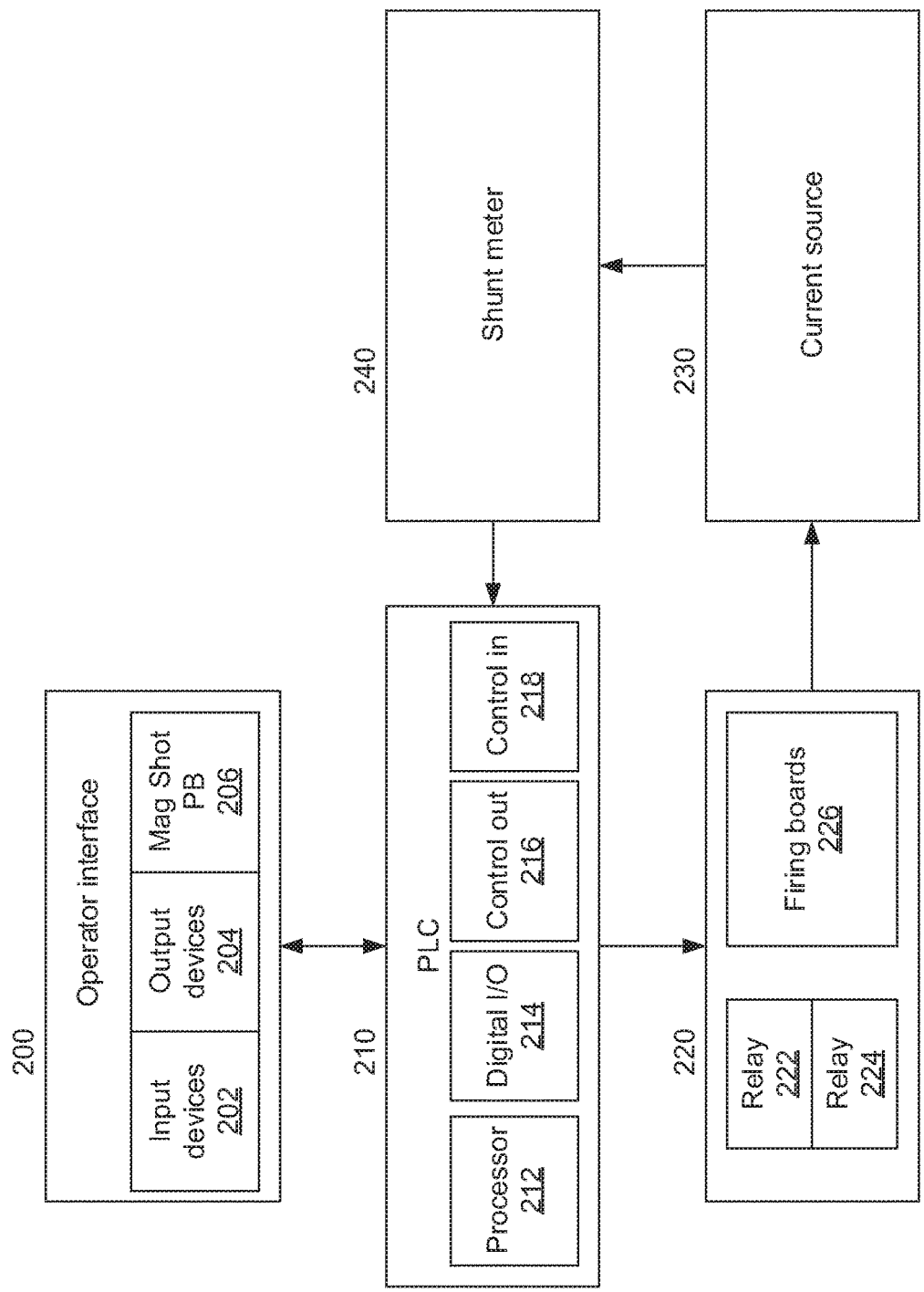
FIG. 2B is a block diagram illustrating another example feedback in a testing system in accordance with aspects of this disclosure.

FIG. 2B is a block diagram illustrating another example feedback in a testing system in accordance with aspects of this disclosure. The testing system of FIG. 2B is similar to the testing system of FIG. 2A except that the DVM 250 is not used. This may be, for example, because the shunt meter 240 and/or the control input circuitry 218 are configured such that the control input interface 218 can receive the feedback from the shunt meter 240.

Figure 3:
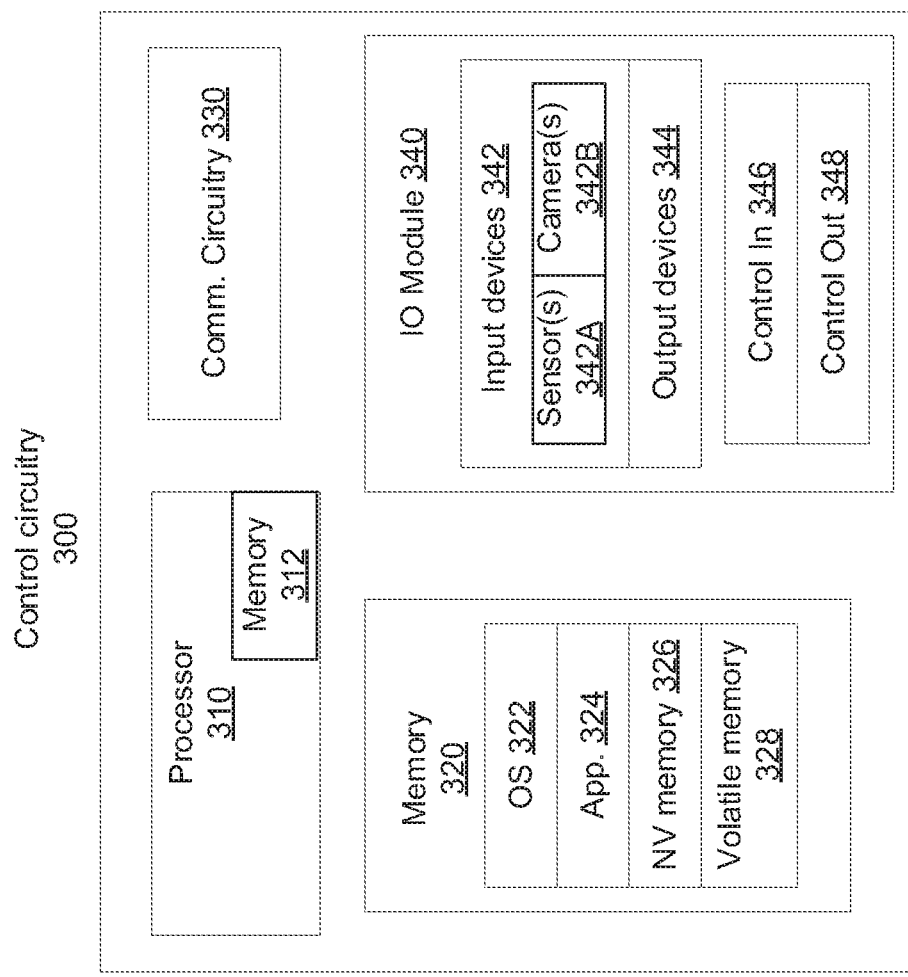
FIG. 3 is a block diagram illustrating an example control circuitry in a testing system in accordance with aspects of this disclosure.

FIG. 3 is a block diagram illustrating an example control circuitry in a testing system in accordance with aspects of this disclosure. FIG. 3 shows a block diagram of an example control circuitry in accordance with an embodiment of the disclosure. Referring to FIG. 3, there is shown an example control circuitry 300 that may be used with various embodiments of the disclosure. The controller 110 may comprise, for example, at least a portion of the control circuitry 300. The control circuitry 300 may comprise, for example, a processor 310, memory 320, a communication circuitry 330, and an IO interface 340. The processor 310 may comprise, for example, one or more processors and/or multiple cores per processor. The processor 310 may be similar to, for example, the processor 212.

The memory 320 may include non-volatile memory 326 and volatile memory 328. The storage for holding local data may be part of the memory 320 or comprise separate memory. The operating system 322 and applications 324 may be stored in, for example, the non-volatile memory 326, and may be copied to volatile memory 328 for execution by the processor 310. Various aspects of the disclosure may use different memory architectures that are design and/or implementation dependent. For example, some aspects of the disclosure may have the operating system 322 and applications 324 in the non-volatile memory 326 executed at least in part from the non-volatile memory 326.

The communication circuitry 330 may allow the control circuitry 300 to communicate with another device via, for example, a wired protocol such as USB, Ethernet, Firewire, etc., or a wireless protocol such as Bluetooth, Near Field Communication (NFC), Wi-Fi, cellular protocol, etc. The communication protocol may also be, for example, a proprietary protocol. The various types of radios for communication may be referred to as a transceiver for the sake of simplicity. The communication may be, for example, with an external electronic device including sensors. The communication circuitry 330 may also be used to communicate with other networks such as local networks, cellular networks, etc.

The control circuitry 300 may also comprise the TO module 340 for communication with a user via the input devices 342 and output information to be displayed on output devices 344. The input devices 342 may comprise, for example, switches, slide switches, buttons, potentiometers, touch sensitive screen, which may be a part of a display, a microphone, etc. The touch sensitive screen may have soft buttons, switches, slide switches, etc. that emulate their physical counterparts. The input devices 342 may also comprise, for example, various sensors 342A, one or more cameras 342B, etc. The sensors 342A may comprise, for example, motion sensors, global positioning system (GPS) sensors, etc. The output devices 344 may comprise, for example, the display, a speaker, LEDs, etc. and may provide status, instructions, etc. to the user. Accordingly, the input devices 342 may be similar to the input device circuitry 202, and the output devices 344 may be similar to the output device circuitry 204.

Various applications (software, firmware, etc.) may be used to process inputs. For example, a voice recognition application may be used to process voice commands, a pattern recognition application may be used to identify objects, locations on an object, and/or patterns. For example, the camera 342B may provide pictures or video of the part 130 that was tested by the testing system 100. The pattern recognition application may then identify areas of the part 130 where there are concentrations of the magnetic particles, and then those areas may be compared with a database to determine whether those areas may indicate fault(s) in the part 130.

The IO module 340 may also comprise control input circuitry 346 and the control output circuitry 348 that may be used to interface to other modules and/or electronic circuitry. The TO module 340 may also comprise control input circuitry 346 that may be similar to the control input circuitry 218 and the control output circuitry 348 may be similar to the control output circuitry 216. The control input circuitry 346 may be configured to receive analog and/or digital signals, and the control output circuitry 348 may be configured to output analog and/or digital signals.

The processor 310 may operate using different architectures in different embodiments. For example, the processor 310 may use the memory 320 to store instructions to execute, or the processor 310 may have its own memory 312 for its instructions, where the memory 312 may comprise, for example, volatile and/or non-volatile memories.

Various embodiments may use other architectures where the different functionalities may be grouped differently. For example, the grouping may be in different integrated circuit chips. Or the grouping may combine different devices such as the TO module 340 and the communication circuitry 330 together, etc. Additionally, the control circuitry 300 may refer logically to various physical devices. For example, one or more of the output devices 344 may be at a different location than one or more of the input devices 342.

While various physical devices, including a touch panel, may be used to control various functions of the testing system 100, voice may also be used to give commands to control the various functions. The voice input may be received by, for example, a microphone that is a part of the input devices 342 of the control circuitry 300. The voice commands may be processed by, for example, the processor 310 to determine the specific command. The specific command may then be used to control the testing system 100. The software for voice recognition may be part of, for example, the operating system 322 and/or the applications 324 in the memory 320.

Accordingly, it can be seen that the control circuitry 300 may be configured for different uses, including, for example, for the operator interface 200, the PLC 210, the controller 110, and for any other portion of the testing system 100 as needed. In some embodiments, the control circuitry 300 may be used to perform the functions of at least some of the operator interface 200 and the PLC 210.

It may also be noted that while the control circuitry 300 is shown as a block 300, various aspects of the disclosure may provide for different parts of the control circuitry 300 to be physically separate. For example, one or more of the camera(s) 342B may be mounted to different parts/locations of the example testing system 100.

Figure 4:
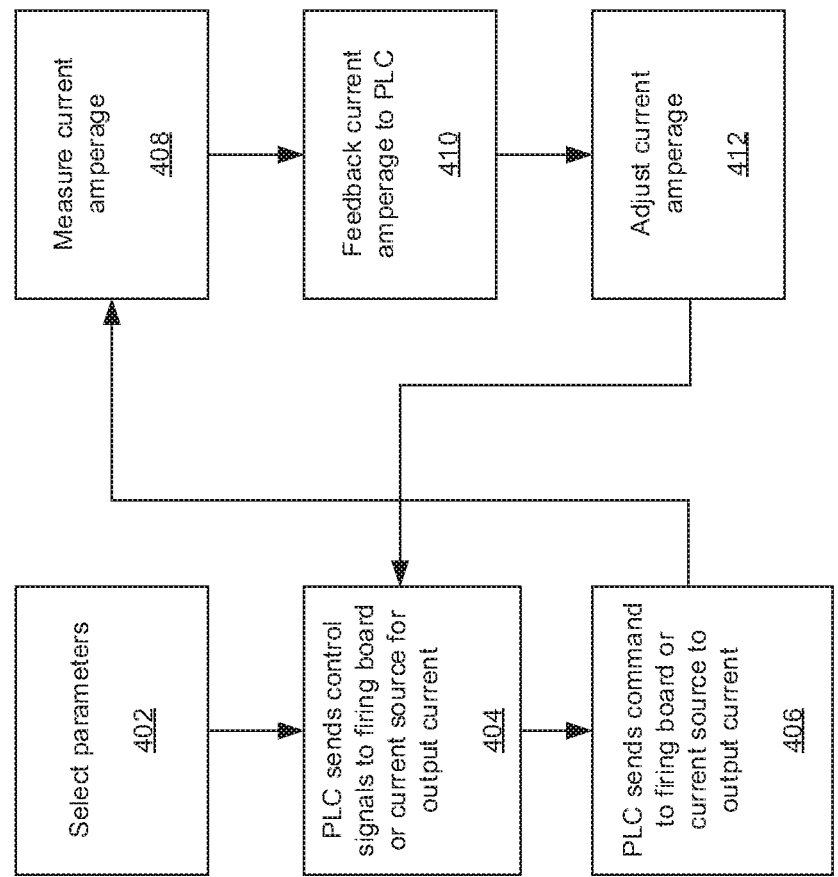
FIG. 4 is a flow diagram illustrating usage of an example testing system in accordance with aspects of this disclosure.

FIG. 4 is a flow diagram illustrating usage of an example testing system in accordance with aspects of this disclosure. Referring to FIG. 4, there is shown a flow diagram 400 comprising blocks 402 to 412. In block 402, parameters may be selected for mag shots in, for example, the testing system 100. The selected parameters may include, for example, an amperage of a mag shot, a duration of the mag shot, a frequency of the mag shot, etc. The selected parameters may also include, for example, whether the mag shot is AC or DC.

The parameters may be selected via, for example, the operator interface 200 or the parameters may be selected at another electronic device, for example, the external device 150, and downloaded to the testing system 100 via the communication circuitry 330. The parameters may then be communicated to the PLC 210.

In block 404, the parameters may be processed by the processor 212, and the processor 212 may configure the control out circuitry 216 to output appropriate signals to the firing board(s) 226 or the current source 230 to control the mag current amperage. In block 406, the PLC 210 may output a signal to the firing board 226 or the current source 230 to generate a trigger signal to the current source 230 so that the current source 230 may output a mag shot. The signal to the firing board 226 or the current source 230 may be, for example, when the mag shot button 206 is pressed in a manual mode, or a mag shot signal is received from an external device 150, or when the processor 212 or the control out circuitry 216 determines that the next mag shot should be generated.

In block 408, the shunt meter 240 may measure the current amperage of the mag shot. In block 410, the current amperage may be fed back to the PLC 210 via, for example, the control input circuitry 218. In some embodiments, the output of the shunt meter 240 may be provided to the DVM 250, where the DVM 250 may amplify the feedback signal appropriately for input to the control input circuitry 218. In block 412, the processor 212 may use the feedback information to adjust the mag shot amperage.

Using the PLC 210 in the feedback loop allows a fast response time when a change is seen in the output current due to, for example, a load on the electrical system. Accordingly, fast adjustment of the mag shot amperage using the feedback response with the PLC 210 is very advantageous. As can be seen, the PLC 210 also allows fine tuning the response loop via the flexible programming, whereas a system that requires a user to look at the output of the mag shot, and then manually adjust subsequent mag current may be too slow for some usage, such as, for example, inspecting many parts rapidly and accurately. Additionally, circuit boards may not be able to provide a similar response time due to its design limitations. One such limitation may be due to, for example, use of capacitors and/or inductors for some timing functions or measuring functions. Additionally, previous designs may not allow the accuracy or repeatability of the present embodiments of the disclosure that use PLC as part of the feedback loop.

As the testing system 100 may damage the part 130 if the mag shot amperage is larger than a specified limit, it is advantageous to control the mag shot amperage quickly and accurately to avoid damage to the part 130.

Various embodiments of the disclosure may disclose a magnetic particle inspection system that is configured to generate a magnetic field for inspection of a part, and which comprises a programmable logic controller (PLC) configured to communicate an amperage signal, for amperage of an output current, to a current source, and communicate a first signal to the current source to output the output current. The system also comprises a current source configured to adjust the amperage for the output current based on the amperage signal, and output the output current upon receiving the first signal. The system further comprises a current sensing device configured to measure an output amperage of the output current, and communicate amperage information based on the output amperage to a signal conversion device, where the signal conversion device is configured to provide feedback information, based on the amperage information, to the PLC, and where the PLC is configured to update the amperage signal, based on the feedback information, and communicate the updated amperage signal to the current source.

The output current may be one of an AC current or a DC current. The output current may be provided through the part under test to generate the magnetic field for the part, or the output current may be provided to a magnetic field generator that is configured to generate a magnetic field in at least one orientation for testing the part.

The system may comprise an interface configured to receive a first input for amperage of the output current and a second input to output the output current, where one or both of the first input and the second input are received from a device external to the magnetic particle inspection system.

The magnetic particle inspection system may be configured to communicate with the external device via one or both of wireless communication or wired communication. The second input may be via one of a soft button that is part of a display on the interface, a physical input device that is not part of a display on the interface, or from a device external to the magnetic particle inspection system. The physical input device may be part of the interface or may be a second physical device that is not a part of the interface.

The current sensing device may be configured to provide amperage information for the output amperage as a first number of mVs per a second number of amperes. The signal conversion device may be configured to receive the amperage information, and convert the amperage information to feedback information in a third number of mVs per the second number of amperes.

The current source may comprise a firing board that is configured to receive the amperage signal, and the firing board may be configured to provide a firing board amperage signal for the current source to configure the amperage of the output current. The current source may comprise a firing board that is configured to receive the first signal, and the firing board may be configured to provide a second signal for the current source to output the output current. The current sensing device may be, for example, a shunt meter and the signal conversion device may be, for example, a digital voltmeter.

Various embodiments of the disclosure may also disclose a magnetic particle inspection system configured to generate a magnetic field for inspection of a part, comprising a programmable logic controller (PLC) configured to communicate an amperage signal, for amperage of an output current, to a current source; and communicate a first signal to the current source to output the output current.

The system may also comprise, for example, a current source configured to adjust the amperage for the output current based on the amperage signal, and output the output current upon receiving the first signal. The system may also comprise a current sensing device configured to measure an output amperage of the output current, and communicate amperage information based on the output amperage to the PLC as feedback information, where the PLC may be configured to update the amperage signal, based on the feedback information, and communicate the updated amperage signal to the current source.

The system may comprise an interface configured to receive a first input for amperage of the output current and a second input to output the output current, where one or both of the first input and the second input may be received from a device external to the magnetic particle inspection system.

The current source may comprise a firing board that is configured to receive the amperage signal, and the firing board is configured to provide a firing board amperage signal for the current source to configure the amperage of the output current, and receive the first signal, and the firing board may be configured to provide a second signal for the current source to output the output current.

Various embodiments of the disclosure may also disclose a method for using a magnetic particle inspection system, comprising receiving input for amperage for an output current used to generate a magnetic field to inspect the part, communicating, by a programmable logic controller (PLC), the amperage for the output current to a current source, and upon receiving an input to provide the output current, communicating by the PLC a signal to the current source to output the output current. The method may also comprise measuring, by a current measuring device, an output amperage of the output current, providing feedback information, based on the output amperage, to the PLC, and adjusting, by the PLC, the amperage of the output current based on the feedback information.

The method may further comprise communicating, by the current measuring device, amperage information for the output amperage to a signal conversion device, and providing, by the signal conversion device, the feedback information, based on the amperage information, to the PLC.

Accordingly, the present methods and systems may be realized in hardware, software, and/or a combination of hardware and software. The present methods and/or systems may be realized in a centralized fashion in at least one computing system or in a distributed fashion where different elements are spread across several interconnected computing systems. Any kind of computing system or other apparatus adapted for carrying out the methods described herein is suited. A combination of hardware and software may include a general-purpose computing system with a specific program or other code that, when being loaded and executed, controls the computing system such that it carries out the methods described herein. Another implementation may comprise one or more application specific integrated circuit or chip designed for cutting/abrading tools. Some implementations may comprise a non-transitory machine-readable (e.g., computer readable) medium (e.g., FLASH memory, optical disk, magnetic storage disk, or the like) having stored thereon one or more lines of code executable by a machine, thereby causing the machine to perform processes as described herein. As used herein, the term "non-transitory machine-readable medium" is defined to include all types of machine readable storage media and to exclude propagating signals.

As utilized herein the terms "circuits" and "circuitry" refer to physical electronic components (i.e. hardware) and any software and/or firmware ("code") that may configure the hardware, be executed by the hardware, and or otherwise be associated with the hardware. As used herein, for example, a particular processor and memory may comprise a first "circuit" when executing a first set of one or more lines of code and may comprise a second "circuit" when executing a second set of one or more lines of code. As utilized herein, "and/or" means any one or more of the items in the list joined by "and/or." As an example, "x and/or y" means any element of the three-element set $\{(x), (y), (x, y)\}$. In other words, "x and/or y" means "one or both of x and y." As another example, "x, y, and/or z" means any element of the seven-element set $\{(x), (y), (z), (x, y), (x, z), (y, z), (x, y, z)\}$. In other words, "x, y and/or z" means "one or more of x, y and z." As utilized herein, the term "exemplary" means serving as a non-limiting example, instance, or illustration. As utilized herein, the terms "e.g." and "for example" set off lists of one or more non-limiting examples, instances, or illustrations. As utilized herein, circuitry is "operable" to perform a function whenever the circuitry comprises the necessary hardware and code (if any is necessary) to perform the function, regardless of whether performance of the function is disabled or not enabled (e.g., by a user-configurable setting, factory trim, etc.).

While the present method and/or system has been described with reference to certain implementations, it will be understood by those skilled in the art that various changes may be made and equivalents may be substituted without departing from the scope of the present method and/or system. For example, block and/or components of disclosed examples may be combined, divided, re-arranged, and/or otherwise modified. In addition, many modifications may be made to adapt a particular situation or material to the teachings of the present disclosure without departing from its scope. Therefore, the present method and/or system are not limited to the particular implementations disclosed. Instead, the present method and/or system will include all implementations falling within the scope of the appended claims, both literally and under the doctrine of equivalents.

What are claimed:

1. A magnetic particle inspection system configured to generate a magnetic field for inspection of a part, comprising:
   a programmable logic controller (PLC) configured to:
   communicate an amperage signal, for amperage of an output current, to a current source; and
   communicate a first signal to the current source to output the output current, wherein the current source configured to:
   adjust the amperage for the output current based on the amperage signal; and
   output the output current upon receiving the first signal; and
   a current sensing device configured to:
   measure an output amperage of the output current; and communicate amperage information based on the output amperage to a signal conversion device,
wherein the signal conversion device is configured to provide feedback information, based on the amperage information, directly to the PLC, and
wherein the PLC is configured to update the amperage signal, based on the feedback information, and communicate the updated amperage signal to the current source.

2. The system of claim 1, wherein the output current is one of an AC current or a DC current.

3. The system of claim 1, wherein the output current is provided through the part to generate the magnetic field for the part.

4. The system of claim 1, comprising a magnetic field generator configured to generate the magnetic field in at least one orientation.

5. The system of claim 1, comprising an interface configured to receive a first input for amperage of the output current and a second input to output the output current.

6. The system of claim 5, wherein one or both of the first input and the second input are received from a device external to the magnetic particle inspection system.

7. The system of claim 6, wherein the magnetic particle inspection system is configured to communicate with the external device via one or both of wireless communication or wired communication.

8. The system of claim 5, wherein the second input is via one of a soft button that is part of a display on the interface, a physical input device that is not part of a display on the interface, or from a device external to the magnetic particle inspection system.

9. The system of claim 8, wherein the physical input device is part of the interface or a second physical device that is not a part of the interface.

10. The system of claim 1, wherein the current sensing device is configured to provide amperage information for the output amperage as a first number of mVs per a second number of amperes.

11. The system of claim 10, wherein the signal conversion device is configured to:
receive the amperage information; and
convert the amperage information to feedback information in a third number of mVs per the second number of amperes.

12. The system of claim 1, wherein the current source comprises a firing board that is configured to receive the amperage signal, and the firing board is configured to provide a firing board amperage signal for the current source to configure the amperage of the output current.

13. The system of claim 1, wherein the current source comprises a firing board that is configured to receive the first signal, and the firing board is configured to provide a second signal for the current source to output the output current.

14. The system of claim 1, wherein the current sensing device is a shunt meter.

15. The system of claim 1, wherein the signal conversion device is a digital voltmeter.

16. A magnetic particle inspection system configured to generate a magnetic field for inspection of a part, comprising:
a programmable logic controller (PLC) configured to:
communicate an amperage signal, for amperage of an output current, to a current source; and
communicate a first signal to the current source to output the output current, wherein the current source is configured to:
adjust the amperage for the output current based on the amperage signal; and
output the output current upon receiving the first signal; and
a current sensing device configured to:
measure an output amperage of the output current; and
communicate amperage information based on the output amperage directly to the PLC as feedback information,
wherein the PLC is configured to update the amperage signal, based on the feedback information, and communicate the updated amperage signal to the current source.

17. The system of claim 16, comprising an interface configured to receive a first input for amperage of the output current and a second input to output the output current, wherein one or both of the first input and the second input are received from a device external to the magnetic particle inspection system.

18. The system of claim 16, wherein the current source comprises a firing board that is configured to:
receive the amperage signal, and the firing board is configured to provide a firing board amperage signal for the current source to configure the amperage of the output current; and
receive the first signal, and the firing board is configured to provide a second signal for the current source to output the output current.

19. A method for inspecting a part using a magnetic particle inspection system, comprising:
receiving input for amperage for an output current used to generate a magnetic field to inspect the part;
communicating, by a programmable logic controller (PLC), the amperage for the output current to a current source;
upon receiving an input to provide the output current, communicating by the PLC a signal to the current source to output the output current;
measuring, by a current measuring device, an output amperage of the output current;
providing feedback information, based on the output amperage, to the PLC; and
adjusting, by the PLC, the amperage of the output current based on the feedback information.

20. The method of claim 19, comprising:
communicating, by the current measuring device, amperage information for the output amperage to a signal conversion device; and
providing, by the signal conversion device, the feedback information, based on the amperage information, to the PLC.

* * * * *